US 6,597,202 B1

(12) United States Patent
McCall et al.

(10) Patent No.: US 6,597,202 B1
(45) Date of Patent: Jul. 22, 2003

(54) SYSTEMS WITH SKEW CONTROL BETWEEN CLOCK AND DATA SIGNALS

(75) Inventors: James A. McCall, Beaverton, OR (US); Hing Y. To, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/039,438

(22) Filed: Dec. 28, 2001

(51) Int. Cl.[7] ............................................. H03K 19/00
(52) U.S. Cl. ........................... 326/93; 326/21; 326/30; 326/82
(58) Field of Search ............................. 326/93, 21, 30, 326/82

(56) References Cited

U.S. PATENT DOCUMENTS 6,397,312 B1 * 5/2002 Nakano et al. ............. 711/167
6,452,421 B2 * 9/2002 Saito ........................... 326/93

* cited by examiner

Primary Examiner—Michael Tokar
Assistant Examiner—Anh T. Tran
(74) Attorney, Agent, or Firm—Alan K. Aldous

(57) ABSTRACT

In some embodiments, the invention includes a controller that has clock signal transmitters to transmit Clk signals and data signal transmitters to transmit Data signals. Multi-phase producing circuitry includes multiple taps to receive a clock signal and in response thereto to produce phases on the taps. Delay determining circuitry determines relative delays to be provided between the Clk signals and Data signals and to provide signals regarding the relative delays, and delay adjustment circuitry receives the signals regarding relative delays and select amongst the taps to achieve the relative delays between the Clk and Data signals. Other embodiments are described and claimed.

28 Claims, 7 Drawing Sheets

SYSTEMS WITH SKEW CONTROL BETWEEN CLOCK AND DATA SIGNALS

BACKGROUND OF THE INVENTION

1. Technical Field of the Invention

The present inventions relate to semiconductor chips and, more particularly, to chips in a system with skew control between clock and data.

2. Background Art

Modules include circuit boards, such as printed circuit boards (PCBs), that have chips (integrated circuits) on one or both sides of the modules. Examples of memory modules include single in line memory modules (SIMMs) and dual in line memory modules (DIMMs). The modules are positioned on motherboards, which may also support a controller, such as a memory controller (which may be integrated with other chipset functions or in a processor).

Typically, a motherboard includes at least two slots to receive modules. Some motherboards, particularly those for server systems, include slots for more than two modules. Systems typically work with different types of modules. Some modules have X number of chips. Other modules have 2X or 4X chips. Some modules have chips on both sides of the PCB. Other modules have chips only one side of the PCB. To be versatile, a memory controller is often capable of functioning under a variety of combinations of different module types in the slots or the absence of modules in a slot.

A path typically has at least one termination device (called a termination), such as a termination resistor, to allow electrical energy to dissipate. Terminations may be positioned on the die and be controllably switchable between enable and disabled states. In other words, the on die termination may be enabled to dissipate energy at some times and be disabled so as not to be able to dissipate energy at other times.

A write clock is a clock signal used in writing data. A write clock for a memory system may be a free running write clock, meaning it runs whether or not data is to be written. By contrast, a strobe may run only when there is a data to be transmitter.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1A:
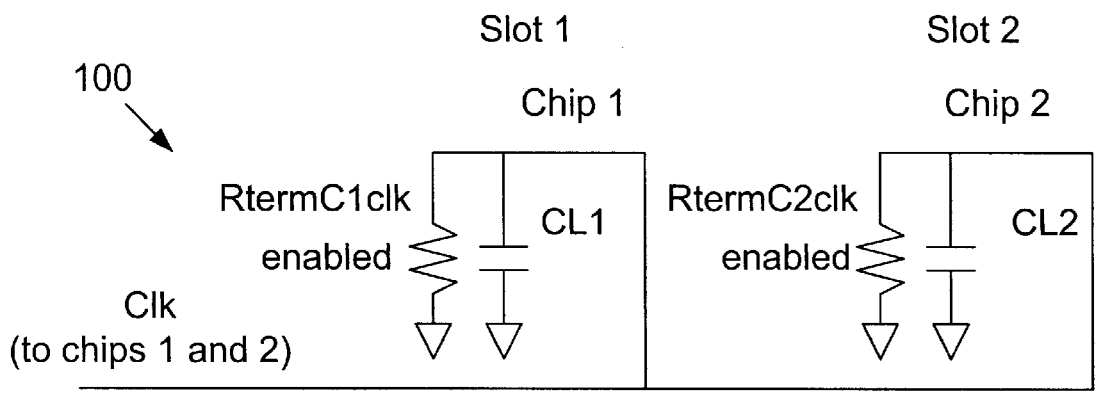
FIG. 1A is a schematic representation of a portion of a system including a chip 1 and chip 2 each having capacitive loading and an enabled termination on a clock path.
Figure 1B:
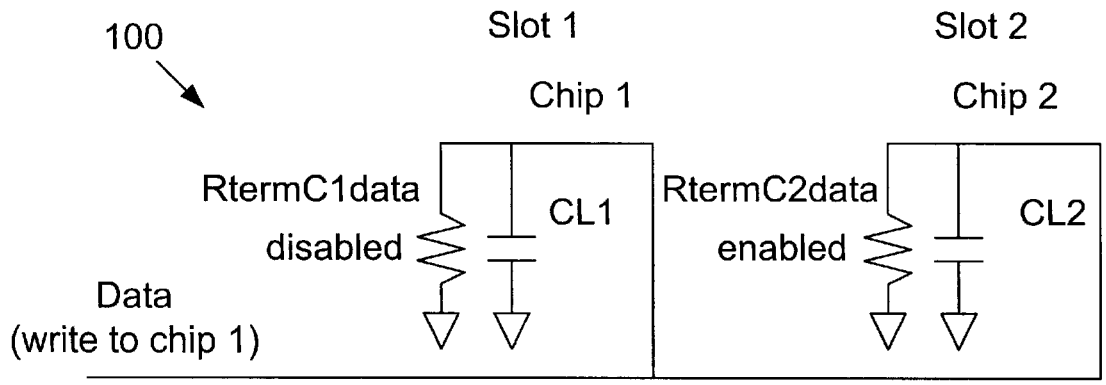
FIG. 1B is a schematic representation of a portion of a system including a chip 1 having capacitive loading and a disabled termination and a chip 2 having a capacitive loading and an enabled termination on a data path.
Figure 1C:
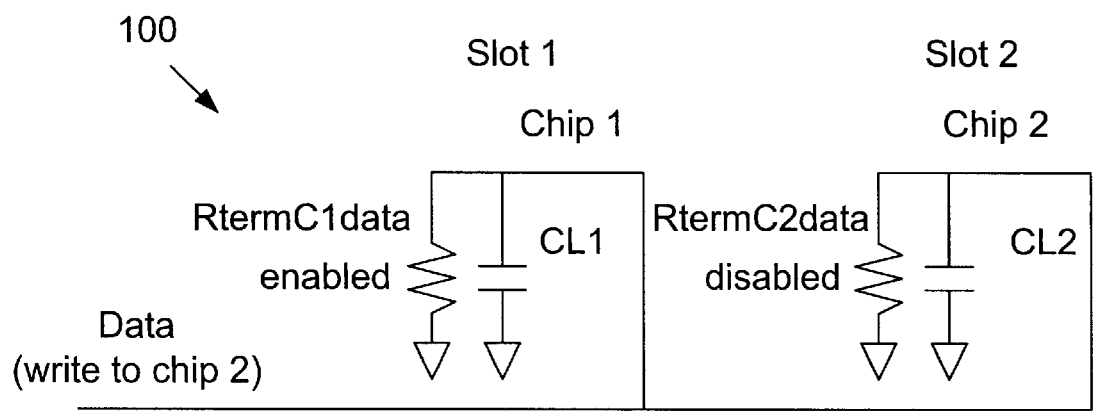
FIG. 1C is a schematic representation of a portion of a system including a chip 1 having capacitive loading and an enabled termination and a chip 2 having a capacitive loading and a disabled termination on a data path.
Figure 5:
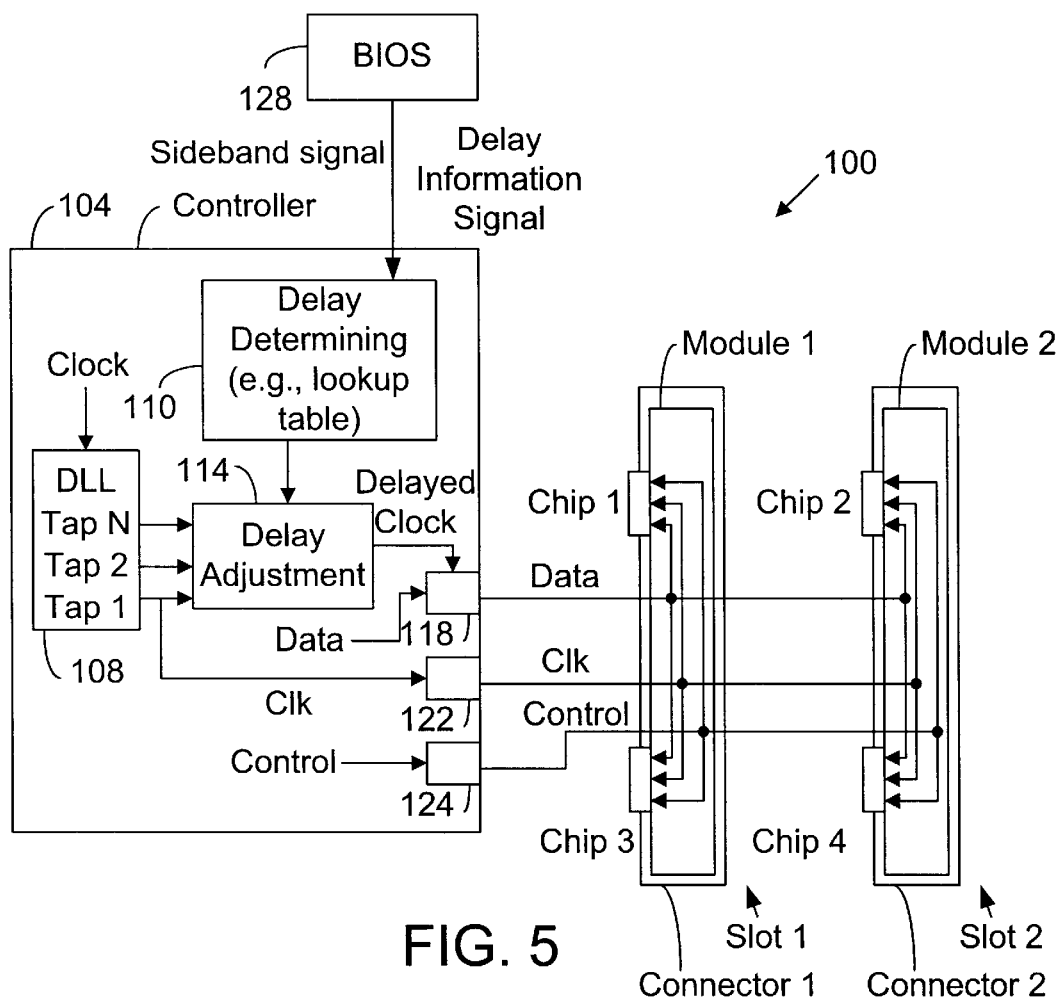
FIG. 5 is a schematic representation of a system including a controller and first and second modules according to some embodiments of the invention.
Figure 6:
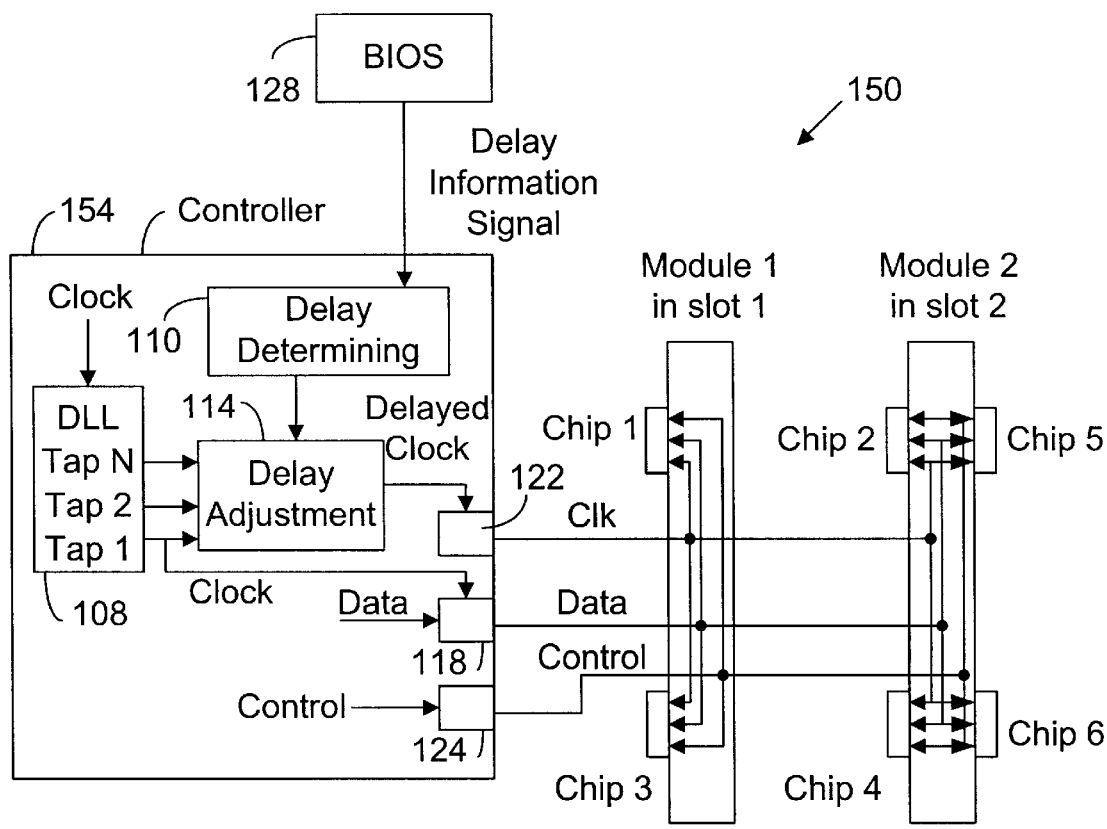
FIG. 6 is a schematic representation of a system including a controller and first and second modules according to some embodiments of the invention.
Figure 7:
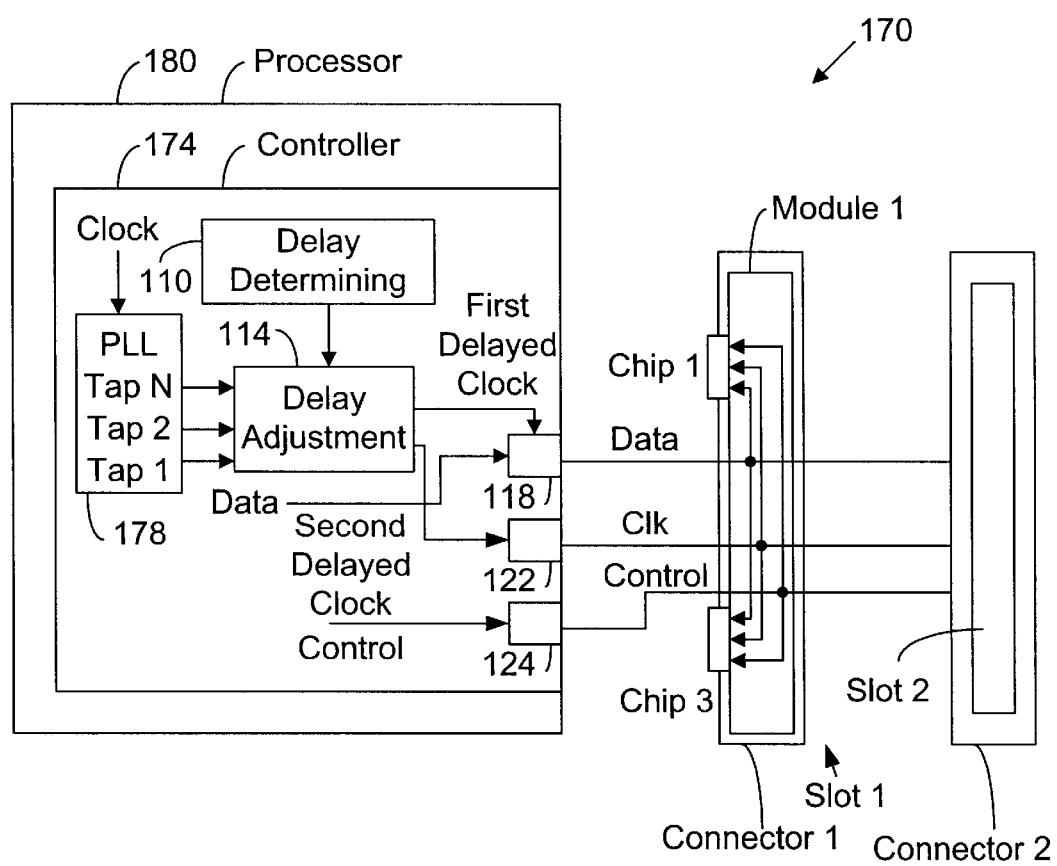
FIG. 7 is a schematic representation of a system including a controller and a first module, but with a second slot not including a module, according to some embodiments of the invention.

FIGS. 1A, 1B, and 1C illustrate chips 1 and 2 in a system 100 which is also illustrated in FIG. 5. Chip 1 is on a module 1 in a slot 1 and chip 2 is on a module 2 in a slot 2. Slots 1 and 2 are slots in connectors 1 and 2, shown in FIG. 5. Systems 150 and 170 in FIGS. 6 and 7 are alternative embodiments to that of FIG. 5. The drawings of this application are shown schematically. The shapes and relative sizes of the components of the drawings are chosen for convenience in illustrating and are not intended to be in an actual relative scale.

Referring to FIG. 1A, chip 1 and chip 2 are on the clock path (line) which carries the clock signal Clk. Chip 1 includes a capacitive load CL1 and chip 2 includes a capacitive load CL2. Chip 1 includes a termination RtermC1clk and chip 2 includes a termination RtermC2clk which are terminations for Clk on a clock path to chips 1 and 2. The terminations are each enabled meaning they will each dissipate energy. As is described below, each of the terminations may include numerous transistors.

FIG. 1B illustrates chip 1 and chip 2 from FIG. 1A on a data path which carries a data signal Data. The capacitive loads CL1 and CL2 for chips 1 and 2 are shown. Chip 1 includes a termination RtermC1data and chip 2 includes a termination RtermC2data which are terminations for a data signal on a data path (line) to chips 1 and 2. In the case of FIG. 1B, Data is written to chip 1, but not chip 2. According to the protocol of system 100, when data is to be written to a chip in slot 1, but not a chip in slot 2, the termination (RtermC1data) for the chip in slot 1 (chip 1) is disabled and the termination (RtermC2data) for the chip in slot 2 (chip 2) is enabled. If there is more than one chip on a data line, all of the terminations for chips on that line in slot 1 may be disabled and all of the terminations for chips on that line in slot 2 may be enabled. A disabled termination does not dissipate energy and can be thought of as an open. Having terminations disabled in chip(s) in the slot being written to and disabled in chips in the slot not being written to may lead to better signal integrity and lower power dissipation. In practice, there will usually be many data conductors carrying many data signals, but for simplicity only one data signal is shown here. In some schemes, there will be one conductor carrying a clock signal for each N conductors carrying data signals. Merely as an example, N might be 8 or some other number. There may be a different termination for each path (line) although only one is shown.

FIG. 1C illustrates chip 1 and chip 2 from FIGS. 1A and 1B on the data path of FIG. 1B and includes the same capacitive loads and terminations as in FIG. 1B. In contrast to FIG. 1B, in the case of FIG. 1C, Data is written to chip 2, not chip 1. According to the protocol of system 100, when data is to be written to a chip in slot 2, the termination (RtermC1data) for the chip (chip 1) in slot 1 is enabled and the termination (RtermC2data) for the chip (chip 2) in slot 2 is disabled.

The load experienced on the data path (with only one termination enabled) is different than the load on the clock path in which both terminations are enabled. Further, the load on the data path may be different depending on whether the write is to chip(s) in module 1 or chip(s) in module 2. One reason why the load for the write path may be different depending on whether module 1 or module 2 is being written to is there could be a different number of chips on the data path for module 1 than are on the data path for module 2. If there is a different load, it will take a different amount of time for the data to propagate. Examples of different loads are given below with reference to FIGS. 5–7.

Figure 2:
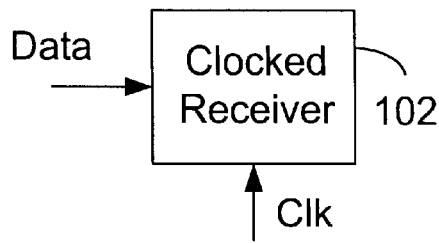
FIG. 2 is a schematic representation of a clocked receiver.

FIG. 2 illustrates a clocked receiver 102 which is included in the chips of FIGS. 5–7. In practice, a variety of clocked receivers are used in chips and clocked receiver 102 is intended to be interpreted broadly to include these different varieties. Clocked receiver 102 may be according to a prior art design or a new design. As an example, a transition in the clock signal Clk in clocked receiver 102 causes the data signal Data to be latched or otherwise sampled. For many source synchronous clocking systems, it is ideal for Clk to transition in clocked receiver 102 when the center of the data cell is being received by clocked receiver 102. However, because of the different loads for Clk and data signals, if Clk and Data are centered with respect to each other at the time of transmitting from controller 104 in FIG. 5, they will not be centered at the time they are received at clocked receiver 102. Accordingly, the invention involves providing a delay to Clk or Data signals so that they will be properly aligned (e.g., centered) when received by clocked receiver 102. Note that the invention is not limited to use with systems in which centering the Clk with respect to the data is considered ideal. Some other ideal relationship could exist.

Figure 3:
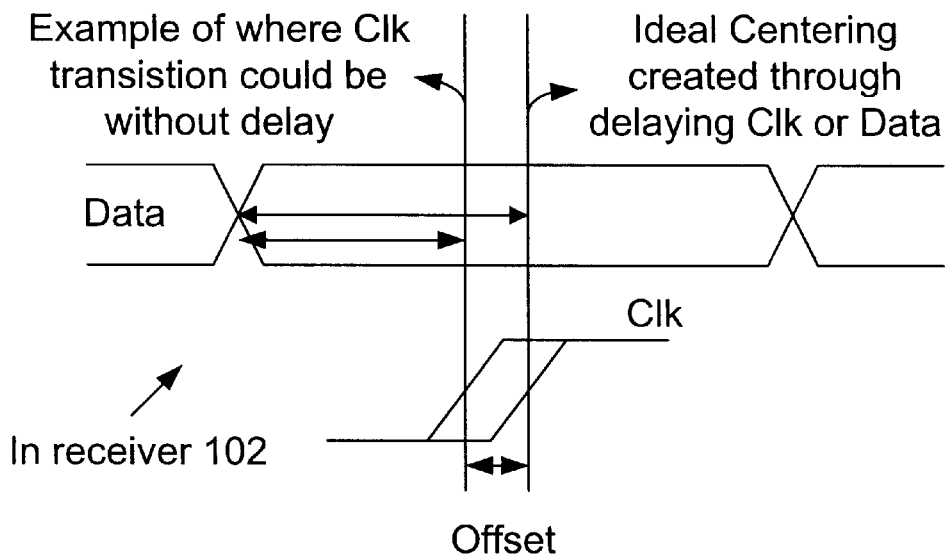
FIG. 3 is a graphical illustration of the relationship between Clk and Data with and without adjusted delay from the perspective-of a receiver.

FIG. 3 illustrates Clk and Data signals in clocked receiver 102 with and without a delay between Clk and Data at the transmitting side in controller 104. Two positions of Clk are shown to show relative differences, but two positions of data could have been shown. The difference can be caused by a delayed Clk, a delayed Data or delaying both by different amounts in controller 104. With the delay in controller 104, the Clk and Data are properly aligned (e.g., centered) in clocked receiver 102. Without the intention delay in controller 104, Clk and Data would not be properly aligned in clocked receiver 102.

Figure 4:
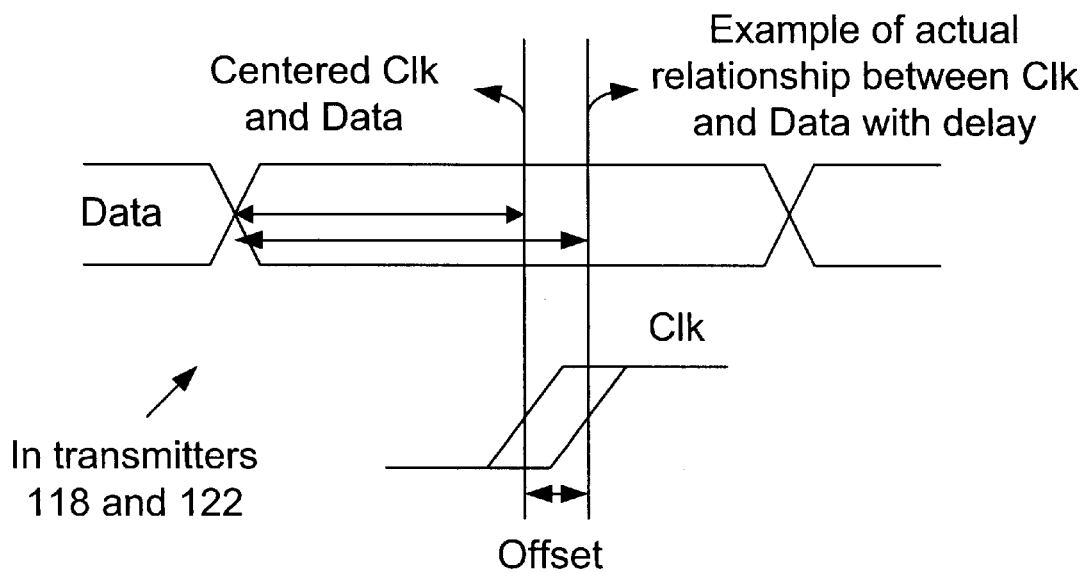
FIG. 4 is a graphical illustration of the relationship between Clk and Data with and without adjusted delay from the perspective of a transmitter.

FIG. 4 illustrates Clk and Data signals as transmitted by transmitters 118 and 122 in controller 104 of FIG. 5. Two positions of Clk are shown to show relative differences between Clk and Data in transmitters 118 and 122, but two positions of Data could have been shown to show the relative difference. The delay difference can be caused by a delayed Clk, a delayed Data or delaying both by different amounts in controller 104. Without the delay, the Clk and Data signals would not be properly aligned in clocked receiver 102. The Offset between the undelayed and delayed Clk is shown in FIGS. 4 and 5.

FIG. 5 illustrates system 100 which includes controller 104 and modules 1 and 2. Modules 1 and 2 are positioned in slots 1 and 2, respectively, which are not shown because they are filled by modules 1 and 2. Only chips 1, 2, 3, and 4 are shown, but in practice more chips could be included in modules 1 and 2. The chips may be memory chips and modules 1 and 2 be memory modules, but the invention is not so limited. Controller 104 includes a delay locked loop (DLL) 108 which receives a periodic clock signal (Clock) and produces signals on a series of taps (tap 1, tap 2, . . . tap N). In the example of FIG. 5, tap 1 might be in phase with the Clock and the other taps out of phase with the Clock in a controlled manner. In the case of system 100, delay determining circuitry 110 decides how much to delay Data with respect to the Clk. Delay adjustment circuitry 114 picks one of the taps of DLL 108 to provide a delayed clock signal to clock Data in transmitter 118 so Data and Clk have a relative delay as transmitted by transmitters (drivers) 118 and 122. DLL 108 is an example of multi-phase producing circuitry. A phase locked loop (PLL) is another example of multi-phase producing circuitry and could be used in place of DLL 108. FIG. 7 shows a PLL 178.

Control signals are provided to chips of modules 1 and 2 through a transmitter 124. The control signals may also be delayed through Delay Adjustment Circuitry 114. The Data, Clk, and Control lines to chips 1, 2, 3, and 4 of modules 1 and 2 could each include multiple lines and the invention is not restrictive as to which Data lines go to which chips, which Clk lines go to which chips, and which Control lines go to which chips. As mentioned, there may be one Clk line for every N Data lines. Note that Data represents various data signals and Clk represents various clock signals on the Clk and Data paths. Likewise, transmitters 118 and 122 represent various corresponding transmitters.

Delay determining circuitry 110 determines the relative delay between Clk and Data and delay adjustment circuitry 114 implements that delay through selecting desired taps of DLL 108.

Delay determining circuitry 110 may include a lookup table that specifies a particular relative delay if particular types of modules and included in slots 1 and 2 (or additional slots if present in the system). However, a lookup table is not required. The BIOS 128 may provide signals to delay determining circuitry 110 to indicate the type of modules. For example, in system 100 in FIG. 5, there are two modules, each having the same number of chips on the same sides of the modules. FIG. 6 illustrates a system 150 where module 1 and 2 have a different number of chips and module 2 has chips on both sides of module 2. FIG. 7 illustrates a system 170 in which only module 1 is included. Slot 2 of connector 2 does not have a module. In the case of system 100, the delay may be the same whether the write is to chips in slot 1 or slot 2. In the case of system 150, the delay may be different depending on whether the write is to slot 1 or slot 2. Further, the desired relative delay between Data and Clk in transmitters 118 and 122 for writes to slot 1 may be different in system 100, system 150, and system 170. The desired relative delay between Data and Clk in transmitters 118 and 122 for writes to slot 2 may be different in system 100 and system 150.

There are various ways in which the controller can be implemented. For example, in system 100 of FIG. 5, in controller 104, tap 1 provides the Clk signal to be transmitted by transmitter (driver) 122 and one of taps 2 . . . N provides a delayed clock signal for transmitter 118 to clock Data. In system 150 of FIG. 6, in controller 154, tap 1 provides a clock signal for transmitter 118 to clock Data and one of taps 2 . . . N provides a delayed clock signal (which is Clk) to be transmitted by transmitter 122. In system 170 of FIG. 7, in controller 174, delay adjustment circuitry 114 uses different taps to provide a first delayed clock signal for transmitter 118 to clock Data and a second delayed clock signal (which is Clk) to transmitter 122.

In some embodiments, the different types of modules or absences of them can be determined at boot up through BIOS 128 and provided to delay determining 110. The signals from BIOS 128 may be through a sideband signal path or otherwise. The type of module can be coded in the module and read during bootup or at another time. A proper delay for writing to chips associated with different slots with different types of modules could be stored in the lookup table. In other embodiments, actual tests could be made after or during boot-up to determine the relative delays between Clk and Data that lead to proper centering with writes to the chips of various slots. For example, system 170 does not rely on BIOS 128. The actual tests may be used in conjunction with BIOS or separate from it.

Controller 104, 154, and 174 may be in a chipset, processor, or other circuitry. For example, in FIG. 7, controller 174 is in a processor 180.

Figure 8:
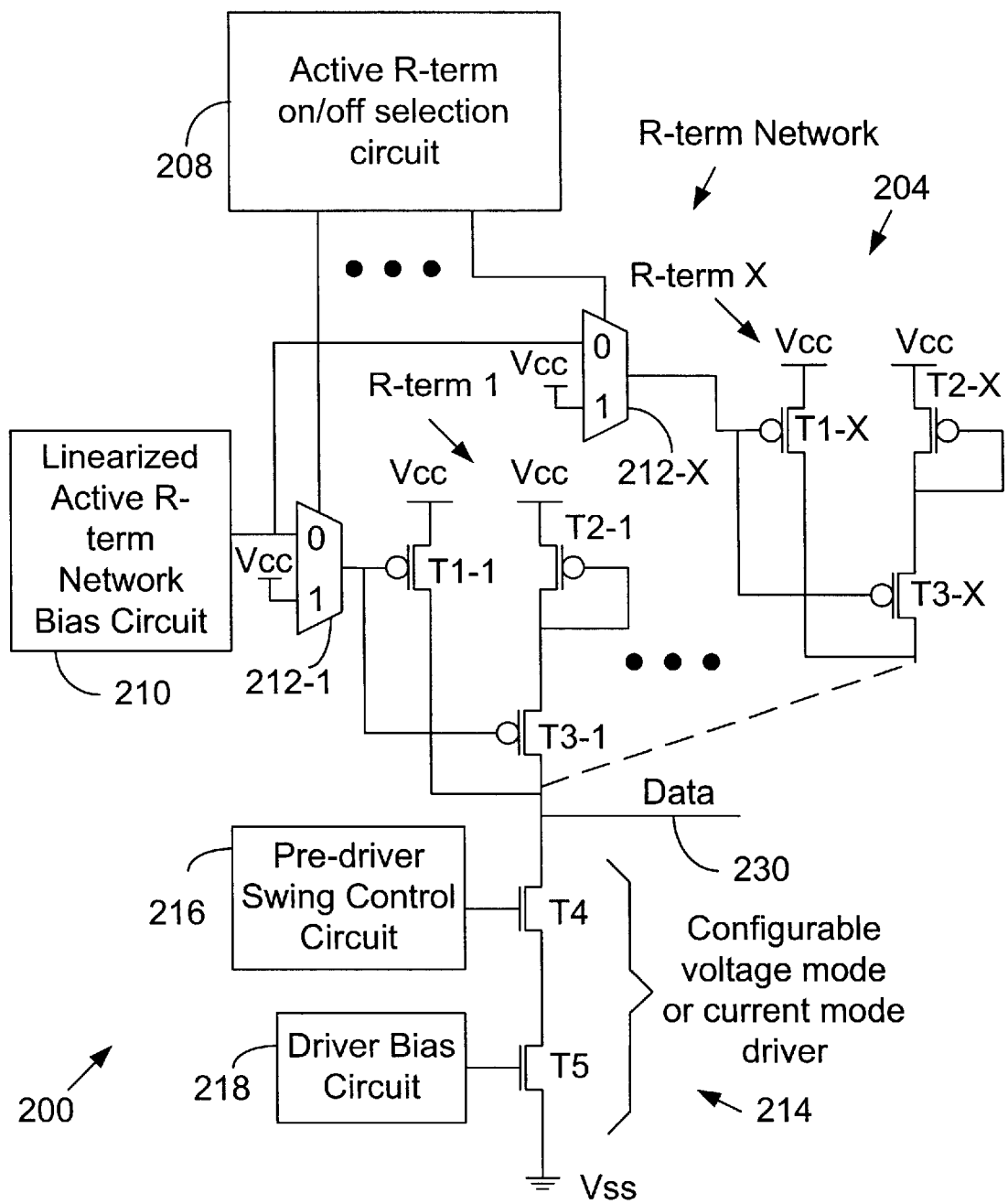
FIG. 8 is a schematic representation of a controllable termination system according to some embodiments of the invention.

There are a variety of implementations of controllable terminations and associated control circuitry to selectively enable or disable on die terminations. A system 200 in FIG. 8 is one example and a system 240 in FIG. 33 are examples of circuits that can be used selectively enable or disable on die terminations. Various other circuits could be used and the invention is not restricted to these details of systems 200 and 240. For example, the R-termination elements could be pull down rather than pull up. Systems 200 and 240 include an R-termination network 25 204. Referring to FIG. 8, R-termination network 204 includes X number of R-termination elements R-term 1, . . . R-term X. Depending on the implementation, X may be as low as less than 5 to more than 100. Each element includes transistors T1, T2, and T3. The R-term elements are controlled by an active R-term on/off selection circuit 208 through multiplexers 212-1 . . . 212-X and a linearized active R-term network bias circuit 210. The control lines shown in FIGS. 5–7 can be used to communicate from the active R-term on/off selection circuit 208 and the R-term network.

In the illustrated system 200, the "1" value of multiplexers 212-1 . . . 212-X is tied to Vcc (but it may be provided by bias circuit 210). The "0" value of multiplexers 212-1 . . . 212-X is provided by bias circuit 210 (but it may be tied to ground). That is, in the illustrated system 200, the "0" value might not be at ground to control how much transistors T1 and T2 are turned on. Some feedback could be used to compensate for temperature, process variations etc. Configurable driver 214 includes pre-driver swing control circuit 216 and driver bias circuit 218. In FIG. 8, network 204 is between power and data node 230 and driver 214 is between data node 230 and ground. That is, the termination is to the power supply voltage node. Alternatively, network 204 could be between node 230 and ground and driver 214 could be between the power supply node and ground. Note that the system can have only one or more than one power supply and ground voltage values.

Figure 9:
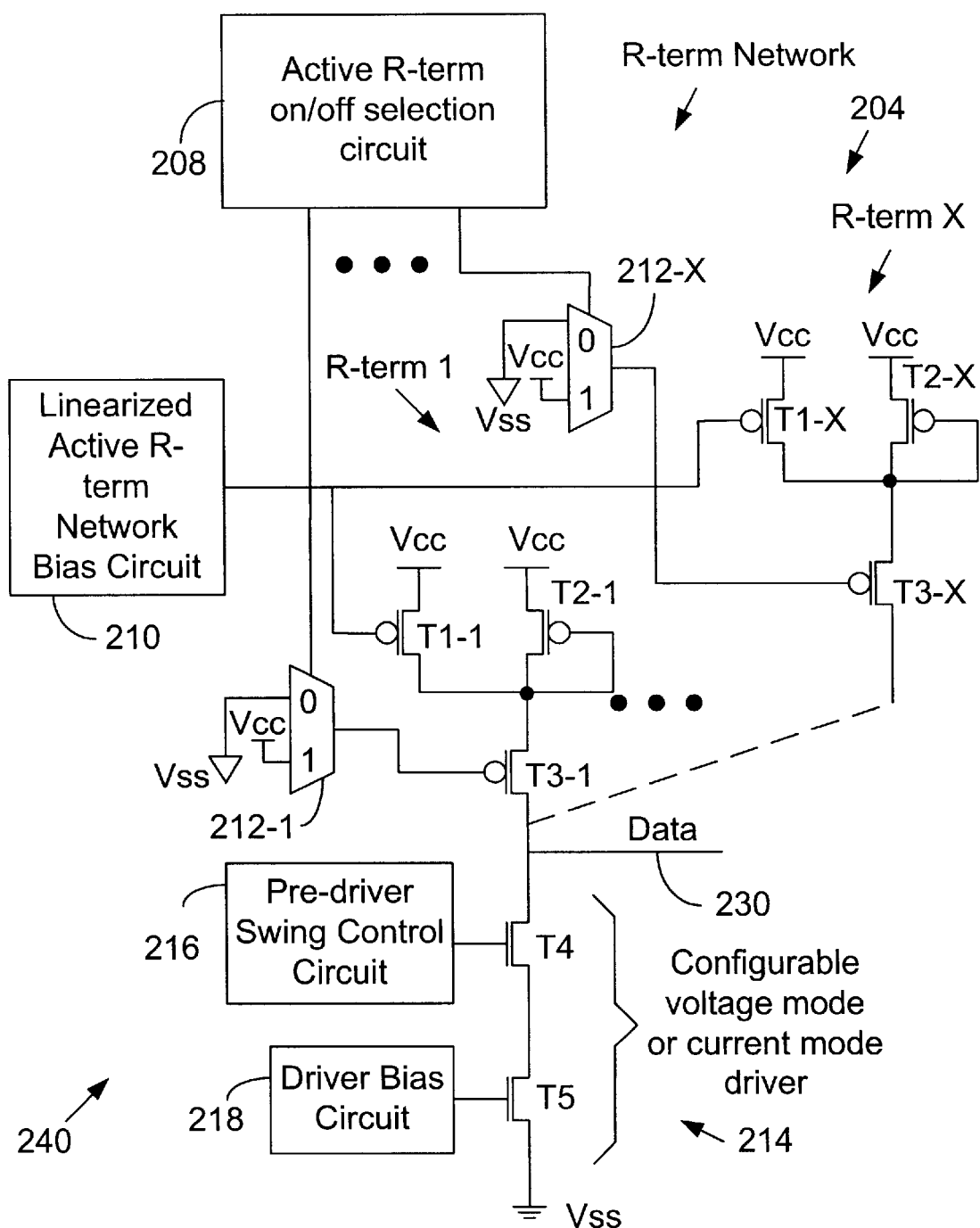
FIG. 9 is a schematic representation of a controllable termination system according to some embodiments of the invention.

Referring to FIG. 9, system 240 is similar to system 200 except as shown. For example, network bias circuit 210 controls the gates of FETs T1-1 and T2-1 . . . T1-X and T2-X. Multiplexers 212-1 . . . 212-X have inputs tied to power and ground. The drains of T1-1 and T2-1 . . . T1-X and T2-X are tied together.

The data paths may be bi-directional. Although writes have been discussed, the invention may also be used with reads. The invention may work best with a constantly (free) running clock, it could be implemented with at least some of the clock signals being strobes. Accordingly, the determine "clock" includes clock or strobe unless the term "free running clock" is used.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A controller comprising:
   clock signal transmitters to transmit Clk signals and data signal transmitters to transmit Data signals;
   multi-phase producing circuitry including multiple taps to receive a clock signal and in response thereto to produce phases on the taps;
   delay determining circuitry to determine relative delays to be provided between the Clk signals and Data signals and to provide signals regarding the relative delays; and
   delay adjustment circuitry to receive the signals regarding relative delays and select amongst the taps to achieve the relative delays between the Clk and Data signals.

2. The controller of claim 1, wherein the delay determining circuitry includes a lookup table to list relative delays for different combinations of module types or their absence from slots.

3. The controller of claim 1, wherein the delay determining circuitry determines the delay based on types of modules to be on a path and which of the modules is to be written to.

4. The controller of claim 1, wherein a clock signal for the clock signal transmitters is provided from a tap through the delay adjustment circuitry.

5. The controller of claim 1, wherein a clock signal for the clock signal transmitters is provided from a tap not through the delay adjustment circuitry.

6. The controller of claim 1, wherein a clock signal for the data signal transmitters is provided from a tap through the delay adjustment circuitry.

7. The controller of claim 1, wherein a clock signal for the data signal transmitters is provided from a tap not through the delay adjustment circuitry.

8. The controller of claim 1, wherein the multi-phase producing circuitry is a delay locked loop.

9. The controller of claim 1, wherein the multi-phase producing circuitry is a phase locked loop.

10. A system comprising:
    a controller including:
    clock signal transmitters to transmit Clk signals and data signal transmitters to transmit Data signals;
    multi-phase producing circuitry including multiple taps to receive a clock signal and in response thereto to produce phases on the taps;

delay determining circuitry to determine relative delays to be provided between the Clk signals and Data signals and to provide signals regarding the relative delays;

delay adjustment circuitry to receive the signals regarding relative delays and select amongst the taps to achieve the relative delays between the Clk and Data signals; and a BIOS to provide module type information to the delay determining circuitry.

11. The system of claim 10, further comprising a first connector including a first slot to receive a first module and a second connector including a second slot to receive a second module.

12. The system of claim 11, wherein there are additional modules.

13. The system of claim 11, further comprising BIOS to determine types of the modules in the first and second slots or absence of a module in the first or second slot and to provide signals regarding the types to the delay determining circuitry.

14. The system of claim 11, wherein the determined relative delays to be provided differ depending on whether the controller is to write to the first module or the second module.

15. The system of claim 11, wherein the determined relative delays to be provided differ depending on the types of at least the first and second modules.

16. The system of claim 11, wherein the determined relative delays to be provided differ depending on the types of at least the first and second modules and which module is to be written to.

17. The system of claim 11, wherein:

when a chip on a path in the first module is written to and a chip on the path in the second module is not written to, an on chip termination for the path in the first module is disabled and an on chip termination for the path in the second module is enabled; and when the chip on the path in the second module is written to and the chip on the path in the first module is not written to, the on chip termination for the path in the second module is disabled and the on chip termination for the path in the first module is enabled.

18. The system of claim 11, wherein the relative delay is determined through actual testing.

19. The system of claim 10, wherein the delay determining circuitry includes a lookup table to list relative delays for different combinations of module types or their absence from slots.

20. A system comprising:

a controller including:

clock signal transmitters to transmit Clk signals and data signal transmitters to transmit Data signals;

multi-phase producing circuitry including multiple taps to receive a clock signal and in response thereto to produce phases on the taps;

delay determining circuitry to determine relative delays to be provided between the Clk signals and Data signals and to provide signals regarding the relative delays;

delay adjustment circuitry to receive the signals regarding relative delays and select amongst the taps to achieve the relative delays between the Clk and Data signals; and a first connector including a first slot to receive a first module and a second connector including a second slot to receive a second module.

21. The system of claim 20, further comprising BIOS to determine types of the modules in the first and second slots or absence of a module in the first or second slot and to provide signals regarding the types to the delay determining circuitry.

22. The system of claim 20, wherein the determined relative delays to be provided differ depending on whether the controller is to write to the first module or the second module.

23. The system of claim 20, wherein the determined relative delays to be provided differ depending on the types of at least the first and second modules.

24. The system of claim 20, wherein there are additional modules.

25. The system of claim 20, wherein:

when a chip on a path in the first module is written to and a chip on the path in the second module is not written to, an on chip termination for the path in the first module is disabled and an on chip termination for the path in the second module is enabled; and when the chip on the path in the second module is written to and the chip on the path in the first module is not written to, the on chip termination for the path in the second module is disabled and the on chip termination for the path in the first module is enabled.

26. The system of claim 20, wherein the relative delay is determined through actual testing.

27. The system of claim 20, wherein the delay determining circuitry includes a lookup table to list relative delays for different combinations of module types or their absence from slots.

28. The system of claim 20, wherein the determined relative delays to be provided differ depending on the types of the first and second modules and which module is to be written to.

* * * * *